United States Patent [19]

Leenders et al.

[11] Patent Number: 5,751,325
[45] Date of Patent: *May 12, 1998

[54] INK JET PRINTING PROCESS

[75] Inventors: Luc Leenders, Herentals; Leo Oelbrandt, Kruibeke; Jan Van den Bogaert, Schilde; Guido Desie, Herent, all of Belgium

[73] Assignee: AGFA-Gevaert, N.V., Mortsel, Belgium

[*] Notice: The term of this patent shall not extend beyond the expiration date of Pat. No. 5,568,173.

[21] Appl. No.: 444,292

[22] Filed: May 18, 1995

[30] Foreign Application Priority Data

Jul. 11, 1994 [EP] European Pat. Off. ............ 94201994
Jan. 31, 1995 [EP] European Pat. Off. ............ 95200227

[51] Int. Cl.$^6$ .............................. B41J 2/205; B41M 5/20
[52] U.S. Cl. .................................. 347/96; 347/100
[58] Field of Search .................................. 347/96, 100

[56] References Cited

U.S. PATENT DOCUMENTS 5,568,173  10/1996  Lenders et al. .................... 347/96

OTHER PUBLICATIONS

Sambucetti, et al. "Chemical Mist Printing", IBM Technical Disclosure Bulletin, vol. 20, #12, May 1978 5423–5424.

*Primary Examiner*—Valerie Lund
*Attorney, Agent, or Firm*—Breiner & Breiner

[57] ABSTRACT

An ink jet printing process comprising the steps of image-wise projecting droplets of liquid onto a receiving material thus bringing into working relationship on said receiving material a reducible metal compound (A), a reducing agent (B) for said metal compound and physical development nuclei (C) that catalyze the reduction of said metal compound to metal.

23 Claims, No Drawings

INK JET PRINTING PROCESS

DESCRIPTION

1. Field of the Invention

The present invention relates to an ink jet printing process operating with an ink containing a reactive component that on catalyzed reaction using a catalyst contained in the ink-receiving material forms a colored product.

2. Background of the Invention

For a long time printing proceeded by pressure-contact of an ink-loaden marker or printing form with a receiving material, normally plain paper.

Nowadays a variety of non-impact printing systems has replaced to some extent classical pressure-contact printing. One of these non-impact printing systems is ink-jet printing.

In ink jet printing [ref. e.g. the book "Principles of Non Impact Printing" by Jerome L. Johnson (1986) Palatino Press, 18792 Via Palatino, Irvine Calif., 92715—USA] tiny drops of ink fluid are projected directly onto a receptor surface for printing without physical contact between the printing device and the receptor. The placement of each drop on the printing substrate is controlled electronically. Printing is accomplished by moving the print head across the paper or vice versa.

Different types of ink jet printing known as "continuous jet" and "drop-on-demand" are described in the above mentioned book of Jerome L. Johnson and in the book "Imaging Processes and Materials Neblette's Eight Edition", Edited by John Sturge et al, Van Nostrand Reinhold-New York (1989), p. 379–384.

Continuous ink jet printing is characterized by pressure-projecting ink through a nozzle to generate drops of ink directed in a continuous stream towards the ink receiving recording element. An image-wise modulated ink-deflection system allows ink droplets of said stream to deposit image-wise on the recording element.

Drop-on-demand or impulse ink jet differs from continuous ink jet in that the ink supply is maintained at or near atmospheric pressure. An ink drop is ejected from a nozzle only on demand when a controlled excitation coming from acoustic pressure generated by piezoelectric element or from pressure generated by local electrothermal evaporation of liquid (thermal bubble-jet) is applied to an ink-filled channel ending in a nozzle.

As described in Journal of Imaging Technology, Vol. 15, Number 3, Jun. 1989 by C.H. Hertz and B.A. Samuelson in their article "Ink Jet Printing of High Quality Color Images", p. 141, 20–40 drops of ink have to be applied to each pixel (elementary picture element) to ensure maximum color density within a commercially acceptable writing time. As can be learned from FIG. 1 of Journal of Imaging Science and Technology—Volume 38, Number 1, 1994 reflection densities not much higher than 1.5 by superposition of 20 drops per pixel can be obtained.

By drop-on-demand ink jet only one drop of ink is deposited per pixel in the image or no ink at all, i.e. drop-on-demand ink jet methods operate as on-off processes. In practice in order to made a record within an acceptable writing time drop-on-demand ink jet printing does not work with ink drops in superposition, and as a consequence thereof in praxis no optical densities of more than 2 can be obtained therewith owing to the small mass of each colored ink droplet and the limited concentration of colorant therein.

It would be a major improvement if ink jet printing could be used for producing images with increased optical density, say of more than 2 without droplet-superposition, or the number of superposed droplets could be reduced and yet high optical densities could be obtained possibly in combination with a high number of reprodicible gray levels.

In IBM Technical Disclosure Bulletin Vol. 23 No. 4 Sep. 1980, W. T. Pimbley describes under the title "Leuco Dye System for Ink Jet Printing" that improved archival properties for ink used in ink jet printing can be attained by means of leuco or vat dyes. Such dyes convert to their permanent form when oxidized. Accordingly, the record medium is first coated or impregnated with an oxidizing agent. Upon combining with the oxidant, the dyes convert to their permanent form, becoming insoluble and having high tinctorial strength and excellent archival properties, such as water fastness and light fastness. However, as in direct thermal recording materials based on the use of leuco dyes it is practically impossible to obtain optical densities higher than 2 certainly with drop-on-demand ink jet printing not operating in dot-superposition.

According to U.S. Pat. No. 4,266,229 a process for information recording comprises producing a fine jet of colorless liquid containing at least one silver salt, modulating the charge density of the jet by applying an electric field in accordance with the information to be recorded, directing the jet of liquid to a recording medium to record said information, and subsequently exposing said recorded information to ordinary light, thereby rendering said recorded information visible. The ink applied in said process includes two basic components. The first major component of the ink is a silver compound, e.g. silver nitrate, and the second major component is the solvent for the silver compound. Said US-P is silent about the composition of the recording medium.

It has been found experimentally by us that the aqueous ink of Example 1 of said US-P, which ink contains dissolved $AgNO_3$ and $HNO_3$, by application with a piezoelectrically modulated ink jet is not capable of yielding in an ink absorbing gelatin layer an optical density (measured in transmission) larger than 2 even when the deposited ink is exposed for a very long period to ordinary light.

OBJECTS AND SUMMARY OF THE INVENTION

It is an object of the present invention to provide an ink jet recording process by means of which substantially black images of high optical density, i.e. of more than 2 in transmission, can be obtained with excellent archival properties.

It is another object of the present invention to provide an ink jet recording process having the capability of yielding high maximum optical density in combination with a high number of reproducible gray levels.

It is a further object of the present invention to provide an ink jet recording process having particularly rapid access time to high density images without substantial overlap of deposited ink drops.

It is a particular object of the present invention to provide an ink jet recording process in which image amplification by catalysis takes place in an ink receptor layer that has been coated from aqueous medium.

Other objects and advantages of the present invention will appear from the following description and examples.

In accordance with the present invention an ink jet printing process is provided comprising the step of image-wise projecting droplets of liquid onto a receiving material thus bringing into working relationship on said receiving material a reducible metal compound (A), a reducing agent (B) for said metal compound and physical development nuclei (C) that catalyze the reduction of said metal compound to metal.

By the step "bringing into working relationship" is meant that when the droplets..touch the image receiving material the ingredients (A), (B) and (C) are brought together so as to form a metal image by physical development. In this physical development a metal image is formed by means of dissolved metal ions that become reduced by a reducing agent in an oxidation-reduction reaction through catalytic action of physical development nuclei.

The physical development nuclei are preferably present on the receiving material before projecting thereon the droplets whereas either at least one member of metal compound (A) and reducing agent (B) is present in said droplets and the remaining member (if any) is present in said material or both members (A) and (B) are present in said material and alkali is present in said droplets.

The metal image formation preferably occurs in the presence of alkali. Further the reduction of the metal compound on the receiving material is speeded up optionally by heat applied to the image receiving material during and/or after deposition thereon of the droplets.

The following embodiments (i), (ii), (iii), (iv) and (v) are preferred embodiments of the process according to the present invention;

(i) droplets containing metal compound (A) are projected imagewise onto the receiving material containing reducing agent (B) and physical development nuclei (C);

(ii) droplets containing reducing agent (B) are projected imagewise onto the receiving material containing metal compound (A) and physical development nuclei (C);

(iii) droplets containing (an) alkaline substance(s) giving the liquid a pH of at least 8 are projected imagewise onto the receiving material containing metal compound (A), reducing agent (B) and physical development nuclei (C);

(iv) a number of droplets containing compound (A) and a number of droplets containing reducing agent (B) are projected imagewise from different jets onto the receiving material containing physical development nuclei (C); and (v) droplets representing a physical developer by the presence of reducing agent (B) in admixture with reducible metal compound (A) that has been shielded against reduction but the reduction of which can take place in the presence of physical development nuclei, are projected imagewise onto the receiving material containing physical development nuclei (C).

In the receiving material the physical development nuclei may be present uniformly or in a patterned structure, the latter being interesting e.g. in the printing of identification documents.

Particularly high optical densities are obtained by physical development of silver compounds but physical development is not restricted thereto. By physical development it is possible to form metal images not only of silver, but likewise of lead, tin, nickel, cobalt, copper, indium and palladium. Metal images such as copper images obtained by physical development can be enhanced by electroless plating and may serve for the production of printed circuits.

In the production of a metal image of high optical density preferably a silver ion source is used in which the silver ions are associated with inorganic or organic anions or are in completed state wherefrom they can be set free.

DETAILED DESCRIPTION OF THE INVENTION

A more detailed description will now be given of the invention and of preferred embodiments with regard to the ingredients of the imaging receiving material and of the "liquid droplets" also referred to as "inks" applied in conjunction therewith.

In a preferred mode of above embodiment (i) a water-based ink in which a reducible inorganic or organic silver compound is dissolved, is applied from ink-jet nozzles.

In a preferred mode of above embodiment (ii) a water-based ink is used in which a reducing agent, preferably an organic reducing agent is dissolved, optionally with the aid of an alkaline substance.

In a preferred mode of above embodiment (iv) a reducible silver compound and a reducing agent therefor are applied image-wise from distinct water-based inks to the receiving material from separate nozzles projecting the droplets in substantial congruency onto the receiving material.

In a preferred mode of above embodiment (v) the ink is a water-based stabilized physical developer containing a dissolved reducing agent in the presence of a silver salt the silver ions of which have been shielded from spontaneous nucleation (i.e. reduction) by reversing their surface charge with a cationic surfactant [ref. the book "Imaging Systems" by Kurt I. Jacobson—Ralph E. Jacobson—The Focal Press—London and New York (1976), p. 113]. In said book a composition of an aqueous stabilized physical developer containing ferrous ammonium sulphate as reducing agent for silver nitrate and having a pH of approximately 1.30 has been disclosed (see Table 5.2, page 113).

By water-based ink is to be understood that the carrier liquid of the ink is water or a mixture of water with (a) water-miscible organic solvent(s), e.g. acetone, containing the silver compounds in sufficiently divided state in order not to cause clogging of the nozzles of the ink jet apparatus.

It is preferred to use watersoluble inorganic metal salts in particular silver salts.

Particularly suitable watersoluble inorganic silver compounds for the process of the present invention e.g. operating according to the hereinbefore mentioned embodiment (1) are e.g. silver nitrate and complex salts of silver with ammonia, amines or thiosulfate or rhodanide (thiocyanate) ions.

Particularly useful watersoluble organic silver compounds for application in the ink are silver acetate, silver lactate, silver salicylate and silver di-(2-ethylhexyl)-sulphosuccinate, the preparation of the lastmentioned compound being described in published European patent application 227 141.

The concentration of the silver compound in the ink is preferably in the range of 0.1 mole/l to 6 mole/l.

A certain alkalinity is in favour of a rapid reduction of the silver ions. The pH of an ink containing the reducible silver compound in the absence of reducing agent is preferably in the range of 7.5 to 11. Where corrosion of the ink jet nozzles may form a problem the pH of the ink is preferably not higher than 8.

According to a particular embodiment the ink contains alkali-precursors that will set free an alkaline substance at elevated temperature, and/or alkaline substances are applied in the ink receiving material.

According to a particular embodiment the ink inherently has already an optical density by containing e.g. a black colorant or mixture of colorants. In that case the optical density of the deposited colorant(s) is added to the optical density of the metal obtained by reduction so that when using a reducible silver compound optical densities of more than 5 can be produced easily. For example, the optical density provided by the deposited colorant(s) is already in the range of 0.8 to 1.5.

As described in the book Imaging Information Storage Technology Edited by Wolfgang Gerhartz—VCH Weinheim—New York—Basel—Cambridge (1992) under the heading "1.13. Ink-jet printing" many of the commercially available ink-jet printers operate with water-based ink (see p. 43 of said book) by which is meant that such inks contain more than 70% by weight of water.

Small amounts of humectants such as glycols are added to reduce the evaporation rate and for continuous ink-jet printing the ink contains some salt in order to obtain a required electrical conductivity and chargeability for electrostatic deflection of the ink droplets. Such salt may be an inorganic watersoluble reducible metal salt, e.g. silver salt complex compound, suited for use in the recording method according to the present invention.

Water-based inks for use according to the present invention may contain a water-miscible solvent such as acetone, ethanol and methanol. Inks containing a major amount of watermiscible organic solvent(s) and that are particularly suited for use in thermal ink-jet printers (a type of drop-on-demand ink jet printers) are described in detail in published European patent application 0 413 442. The solvents used have boiling points from about 50° C. to about 200° C. and are e.g. members of the following group: alkyl glycol ethers, wherein the alkyl group has up to 4 carbon atoms, alkyl pyrrolidinones, ketones and lactones.

The rapid formation of a metal deposit, e.g. silver metal deposit, is based on the catalytic action of nuclei contained in the ink-receiving material, which nuclei show electron conductivity making them able to catalyze the reduction of metal compounds contained in physical developers [ref. the book "Imaging Systems" by Kurt I. Jacobson and Ralph E. Jacobson—The Focal Press, London and New York (1976), p.109].

The development nuclei applied according to the present invention are preferably of the type known applied in silver complex diffusion transfer reversal (DTR) image receiving materials, also called "positive materials", wherein transferred silver complex compounds stemming from an imagewise exposed and developed silver halide emulsion material are reduced to silver metal [ref. "Photographic Silver Halide Diffusion Processes" by André Rott and Edith Weyde—The Focal Press London and New York (1972), p. 54–57].

Preferred nuclei are colloidal noble metal particles, e.g. silver particles and colloidal heavy metal sulfide particles such as colloidal palladium sulfide, nickel sulfide and mixed silver-nickel sulfide. These nuclei may be present with or without binding agent on a very broad variety of supports. They may be applied by common coating techniques using a liquid carrier vehicle, by spraying and even vapour deposition under vacuum conditions, e.g. by sputtering.

According to a particular embodiment they may be formed in situ with reactants contained in the ink-receiving material.

The ink-receiving layer may contain the physical development nuclei in operative contact with physical development accelerators, examples of which are thioether compounds described e.g. in published German patent application (DE-OS) 1,124,354, U.S. Pat. Nos. 4,013,471; 4,072,526 and published European patent allication (EP-A) 0,026,520.

In the embodiment wherein the reducible metal salt is applied by ink jet [see the hereinbefore mentioned embodiment (i)] the development nuclei and reducing agent(s) are present in the same layer or in different layers but in ink-permeable relationship with each other. The ink receiving layer(s) preferably contain a film-forming binder that is permeable for the "ink", or swellable e.g. by water and/or its organic watermiscible solvent(s).

In the embodiment (ii) wherein the reducing agent is applied by ink jet the development nuclei and reducible metal salt(s) are present in the same layer or in different layers but in ink-permeable relationship with each other, so that the silver ions can reach the colloidal diffusible-resistant development nuclei by diffusion.

According to a preferred mode of said embodiment (ii) the ink jet recording material contains together with uniformly distributed physical development nuclei a substantially light-insensitive silver salt known from thermographic recording materials.

Preferred substantially light-insensitive organic silver salts particularly suited for use according to embodiment (ii) of the present invention are silver salts of aliphatic carboxylic acids known as fatty acids, wherein the aliphatic carbon chain has preferably at least 12 C-atoms, e.g. silver laurate, silver palmitate, silver stearate, silver hydroxystearate, silver oleate and silver behenate. Modified aliphatic carboxylic acids with thioether group as described e.g. in GB-P 1,111, 492 and other organic silver salts as described in GB-P 1,439,478, e.g. silver benzoate and silver phthalazinone, may be used likewise to produce a thermally developable silver image. Further are mentioned silver imidazolates and the substantially light-insensitive inorganic or organic silver salt complexes described in U.S. Pat. No. 4,260,677.

The coverage of development nuclei in and/or on top of the ink receiving material may vary widely according to the type of nuclei, but is situated e.g. in the range of 0.01 mg to 100 mg per $m^2$.

Suitable polymeric binders for the ink receiving layer are hydrophilic water-soluble polymers wherein the development nuclei and reducing agent(s) can be applied uniformly from aqueous medium.

The hydrophilic water-soluble binder of the ink receiving layer may be any hydrophilic water-soluble polymeric binder used in the preparation of photographic silver halide emulsion layers.

Preferred are protein-type binding agents such as gelatin, casein, collagen, albumin, or gelatin derivative. e.g. acetylated gelatin. Other suitable water-soluble binding agents are: polyvinyl alcohol, dextran, gum arabic, zein, agar-agar, arrowroot, pectin, carboxymethyl cellulose, hydroxyethyl cellulose, poly(acrylic acid), and polyvinylpyrrolidone that may be used in admixture.

The polymers or mixtures thereof forming the binder of the imaging layer may be used in conjunction with swelling agents or "heat solvents" also called "thermal solvents" or "thermosolvents" improving the reaction speed of the redox-reaction between silver compound and organic reducing agent at elevated temperature.

By the term "heat solvent" in this invention is meant a non-hydrolyzable organic material which is in solid state at temperatures below 50° C. but becomes on heating above that temperature a plasticizer for the binder of the layer wherein they are incorporated and possibly act then also as a solvent for the organic reducing agent.

Thermal solvents having a dielectric constant of at least 10 are preferred. Particularly useful are polyethylene glycols having a mean molecular weight in the range of 1,500 to 20,000 described in U.S. Pat. No. 3,347,675. Further are mentioned compounds such as urea, methyl sulfonamide and ethylene carbonate being heat solvents described in U.S. Pat. No. 3,667,959, and compounds such as tetrahydrothiophene-1,1-dioxide, methyl anisate and 1,10-decanediol being described as heat solvents in Research Disclosure, December 1976, (item 15027) pages 26–28. Still other examples of heat solvents have been described in U.S. Pat. No. 3,438,776, and 4,740,446, and in published EP-A 0 119 615 and 0 122 512 and DE-A 3 339 810.

Gelatin and such polymers that can be applied to form the ink image receiving layer from an aqueous solution may be hardened up to a certain degree wihout destroying their permeability with respect to aqueous liquids. A survey of such binders is given in Research Disclosure November 1989, item 307105 in the chapter IX. "Vehicles and vehicle extenders" and for suitable hardening agents reference is made to chapter X. "Hardeners".

The reducing agent(s) applied in the ink or ink-receiving material may be any kind of developing agent used in silver halide photography and more particularly in silver complex diffusion transfer reversal (DTR-) processing.

According to a particular embodiment a mixture of synergistically active reducing agents is used, e.g. as main reducing agent a polyhydroxy-benzene type reducing agent, e.g. hydroquinone-type reducing agent is combined with a secondary developing agent of the class of 1-phenyl-3-pyrazolidinone compounds and/or N-methyl-aminophenol compounds. For example, a synergistic mixture of developing agents as described in GB-P 989,383, 1,003,783 or 1,191,535 is used.

In order to eliminate a certain background yellowing that may arise by the aerial oxidation of residual hydroquinone type reducing agent an organic reducing agent may be used that yields colorless oxidation products. Compounds such as ascorbic acid containing a keto-enediol-grouping —CO—CHOH— or COH=COH— in a chain or ring-system are suitable for that purpose.

According to a special embodiment the ink and/or ink receiving layer may contain a reducing agent that is poorly active at normal temperature but becomes more active at elevated temperature.

Examples of particularly weak reducing agents are sterically hindered phenols as described e.g. in U.S. Pat. No. 4,001,026 or leuco dyes that on oxidation form a dye, e.g. an indoaniline or azomethine dye.

So, according to a special embodiment the reducing agent in oxidized state represents itself an optical density-increasing colorant, as is the case e.g. with 4-methoxy-1-naphtol forming a blue dye. Bis-phenol reducing agents forming by auto-coupling an optical density increasing dye are described in published European patent application 0 509 740.

The ratio by weight of binder to reducing agent(s) is preferably in the range of 0.2 to 6, and the thickness of the ink receiving layer is preferably in the range of 1 to 20 µm.

As stated already above the reduction of silver compounds deposited by ink jet is speeded up in alkaline medium. For that purpose the ink image receiving material may contain an alkaline substance or substances by means of which in situ, e.g with one or more substances contained in the ink, hydroxyl ions (HO$^-$) can be formed. Suitable in situ alkali-generating compounds are described in U.S. Pat. No. 3,260,598, in published EP-A 0210659, and U.S. Pat. No. 5,200,295. For example, zinc hydroxide is contained in the recording material and ethylenedinitrilo tetraacetate (EDTA) or a picolinate is contained in the ink.

Sodium hydroxide as strong base will be formed in situ at the place of ink deposit when the reducing agent is hydroquinone forming by oxidation a quinone reacting with water of the ink and sodium sulfite contained in the ink-receiving layer to raise the alkalinity and development rate in the area of silver deposit [ref. "A Textbook of Photographic Chemistry" by D. H. O. John and G. T. J. Field—Chapman and Hall LtD Londo (1963), p.75]. Further is mentioned the formation of sodium hydroxide in situ by reaction of an aldehyde such as formaldehyde or ketone, e.g. as acetone, with sodium sulfite (see the same Textbook p. 78).

According to a special embodiment the ink jet recording material contains for application in the hereinbefore described embodiment (1) together with the necessary reducing agent(s) a thermosensitive base releasing agent (alkali-precursor) that after image-wise ink deposition and by overall heating of the recording material will set free an alkaline substance, e.g. an amine.

Thermosensitive base-releasing agents are e.g. guanidine-trichloro-acetate described e.g. in GB-P 998,949. The thermosensitive base-releasing agents may be incorporated in a water-permeable layer being in contact with the water-permeable imaging layer containing the reducing agent(s) and nuclei for silver image formation.

The viscosity of the ink will be adapted to the type of ink jet used. For increasing the viscosity water-soluble polymeric compounds, e.g. polyvinyl pyrrolidone, may be used. A decrease of viscosity may be obtained by means of surface active agents also serving as wetting agents for the ink-receiving layer.

The use of cationic surface active agents in the ink applied according to the hereinbefore mentioned embodiment (v) is necessary to prevent that spontaneous nucleation takes place in the ink containing silver ions and a reducing agent. However, the surfactant may not prevent physical development with physical development nuclei situated in the ink-receiving material. As described in the periodical PS & E, Vol. 13, Number 2, March–April 1969, page 40 the surfactant has to form sufficiently big micelles. These micelles are not capable of penetrating into the ink-receiving polymeric binder layer, e.g. mainly gelatin in an outermost layer of the recording material.

As described in said periodical dodecylamine acetate in combination with a non-ionic surfactant (LISSAPOL N—tradename of ICI) yields preferred physical developers containing silver nitrate as silver source and METOL (tradename) as reducing agent.

In order to obtain a neutral black image tone of the deposited silver a so-called toning agent is advantageously present in the ink and/or in the ink receiving material.

Suitable toning agents are these used in silver complex diffusion transfer (DTR-) processing and are described e.g. in the already mentioned book "Photographic Silver Halide Diffusion Processes", pages 57–64. Preferred toning compounds belong to the class of heterocyclic mercapto compounds such as 1-phenyl-5-mercapto-tetrazole.

The ink receiving layer for use according to the hereinbefore described embodiment (i) may contain an oxidation inhibiting compound preventing premature oxidation of the uniformly present reducing agent(s). For that purpose are mentioned e.g. sulfite compounds that may raise at the same time the alkalinity. Further are mentioned the oxidation inhibitors described in GB-P 1,182,198, e.g. the ammonium salt of a hydroxyl-substituted polybasic aliphatic acid such as tartaric acid and citric acid and saccharides.

In the hereinbefore described embodiment (ii) a said oxidation inhibiting compound may be combined with the reducing agent(s) contained in the ink.

The ink-image receiving layer is commonly coated from an aqueous medium containing the binder in dissolved form but may be applied from aqueous medium containing a hydrophilic water-soluble polymer, e.g. gelatin, in admixture with a dispersed polymer (latex) that may have hydrophilic functionality. Polymers with hydrophilic functionality for forming an aqueous polymer dispersion (latex) are described e.g. in U.S. Pat. No. 5,006,451.

The ink-image receiving layer may further contain antistatic agents, e.g. non-ionic antistatic agents including a fluorocarbon group as e.g. in $F_3C(CF_2)_6CONH(CH_2CH_2O)$—H, plasticizers, friction reducing compounds e.g. in the form of particles protruding from the recording layer, e.g. talc particles and polymer beads with low friction coefficient, and transparent inorganic pigments, e.g. colloidal silica.

The ink-receiving imaging layer is coated preferably on a support being a thin sheet or weblike carrier material that should be stable preferably at heating temperatures of between 60° and 160° C. For example, the support is made from paper, polyethylene coated paper or transparent resin film, e.g. made of a cellulose ester, e.g. cellulose triacetate, polypropylene, polycarbonate or polyester, e.g. polyethylene terephthalate. The support may be subbed if need be to improve the adherence thereof of the hydrophilic ink image receiving layer.

The imaging method according to the present invention can be used for both the production of transparencies and reflection type prints. Such means that the support will be transparent, translucent or opaque, e.g. having a white light reflecting aspect. For example, the support is a paper base which may contain white light reflecting pigments, that optionally may be applied also in an interlayer, e.g. polyethylene layer, between the ink image receiving layer and the support. In case a transparent base is used, said base may be colorless or colored, e.g. has a blue colour as is of use in radiographic silver halide emulsion film finding wide application in inspection techniques operating with a light box.

According to a particular embodiment the ink is projected onto a drafting film having a surface layer that can be written on by pencil and has good absorption properties for aqueous ink jet ink and drawing ink. The drafting film has usually a translucent appearance. Examples of suitable drafting film materials are described in published European patent application 0 565 154.

In the process of the present invention any kind of ink jet printer may be used. Image-wise deposition of ink may proceed by separate, not-overlapping drops or by several drops at least partly in superposition. Drop-on-demand ink jet printers are preferred when demands on resolution are not particularly stringent as e.g. for printing bar code information.

For high resolution purposes and especially for graphic art reproductions preference is given to continuous ink jet printers in which e.g. a 10 micron jet of ink is continuously ejected from a nozzle. By stimulating the nozzle with a piezo-electric crystal the jet breaks up into about 1 million equally sized drops per second. Each individual drop can be on-off controlled by means of electric charging and deflection at the point of drop formation. When they enter a static electric field charged drops will be caught under a knife edge, whereas uncharged drops will reach the ink image receiving material which is normally fastened on a drum. A spatial printing resolution of about 10 pixels/mm can be obtained easily and it is possible to create up to 32 different density levels for each pixel by dot size control. This is accomplished by depositing from 0 to 32 different density levels for building each pixel. A combination of these discrete density levels over a small area of adjacent pixels using a mixing algorithm, called dithering, yields the possibility to produce density levels represented by pixel values, e.g. from 0 to 255.

By "dithering" is meant that halftone cells, called halftone dots, are divided into a pattern formed by tiny spots (pixels) arranged in different number and geometrically different.

According to a particular embodiment in the ink jet printing process according to the present invention ink of different concentration and possibly of different composition of silver compound(s) or reducing agents, and optionally of different optical density by the presence of colorant(s) in different concentration is applied image-wise from different nozzles. The ink expulsion of the different nozzles is actuated in such a way that ink drops stemming from one nozzle produce ink spots with different optical density with regard to another nozzle.

The application of ink jets having different concentrations of metal compound, preferably silver compound, or reducing agent offers the possibility to enlarge the number of reproducible grey levels without need for special dithering or error diffusion processing known in the art for that purpose [ref. e.g. Journal of Electronic Imaging 2(1), 62–66 (January 1993).

"Error diffusion" was introduced by Floyd and Steinberg in "An adaptive algorithm for spatial gray-scale"—Proc. SID 17 (2), 75–77 (1976)].

According to a special embodiment a multiple, e.g. duo inkjet, is used by means of which the droplets merge before reaching the ink receiving material as described e.g. in late Deutsche Demokratische Republik (DD) Patentschriften 218 041, 221 691 and 223 672.

The following examples illustrate the present invention. The percentages, ratios and parts are by weight unless otherwise indicated.

EXAMPLE 1 (comparative example)

Preparation of the Ink

To an aqueous 6 molar silver nitrate solution ammonium hydroxide was added up to pH 10 to end with a 3 molar ammonia-silver nitrate complex solution. To the obtained solution isopropanol was added in 50/50 ratio.

Preparation of Ink-Receiving Materials 1 to 7

Ink-Receiving Material 1

A subbed polyethylene terephtalate support having a thickness of 100 μm was slide hopper coated simultaneously with a subcoat (1) and ink-receiving layer (2).

The subcoat (1) being the same for all the ink-receiving materials was applied at wet coating thickness of 20 μm from the following coating composition having the coverage of its ingredients expressed in $g/m^2$:

| | |
|---|---|
| gelatin | 0.550 |
| HOSTAPON T (tradename) | 0.025 |
| TERGITOL 4 (tradename) | 0.010 |
| perfluoro-octane acid ammonium salt | 0.002 |
| formaldehyde | 0.007 |

The ingredients of the ink-receiving layers 1 to 7 are expressed also by their coverage in g/m².

| Ink-receiving layer No. 1 (non-invention) free of nuclei | |
|---|---|
| gelatin | 0.980 |
| carboxymethyl cellulose (sodium salt) | 0.070 |
| TERGITOL 4 (tradename) | 0.004 |
| sodium hydroxide | 0.009 |
| hydroquinone | 1.000 |
| Ink-receiving layer No. 2 (free of reductor) | |
| gelatin | 0.980 |
| carboxymethyl cellulose (sodium salt) | 0.070 |
| TERGITOL 4 (tradename) | 0.004 |
| sodium hydroxide | 0.009 |
| physical development nuclei dispersion N | 3.480 |

Physical development nuclei dispersion N is a 5.6 % aqueous gelatin solution containing 0.01 mole of colloidal $Ag_2S$-NiS nuclei.

| Ink-receiving layer No. 3 (free of reductor) | |
|---|---|
| gelatin | 0.980 |
| carboxymethyl cellulose (sodium salt) | 0.070 |
| TERGITOL 4 (tradename) | 0.004 |
| sodium hydroxide | 0.009 |
| physical development nuclei dispersion P | 4.050 |

Physical development nuclei dispersion P is a 0.05% aqueous polyvinyl alcohol solution containing 0.0038 mole of colloidal PdS nuclei.

| Ink-receiving layer No. 4 (invention) | |
|---|---|
| gelatin | 0.980 |
| carboxymethyl cellulose (sodium salt) | 0.070 |
| TERGITOL 4 (tradename) | 0.004 |
| sodium hydroxide | 0.009 |
| physical development nuclei dispersion N | 3.480 |
| hydroquinone | 1.000 |
| Ink-receiving layer No. 5 (invention) | |
| gelatin | 0.980 |
| carboxymethyl cellulose (sodium salt) | 0.070 |
| TERGITOL 4 (tradename) | 0.004 |
| sodium hydroxide | 0.009 |
| physical development nuclei dispersion N | 4.050 |
| hydroquinone | 1.000 |
| Ink-receiving layer No. 6 (invention) | |
| gelatin | 0.980 |
| carboxymethyl cellulose (sodium salt) | 0.070 |
| TERGITOL 4 (tradename) | 0.004 |
| sodium hydroxide | 0.009 |
| physical development nuclei dispersion P | 3.480 |
| ethyl gallate | 1.000 |
| Ink-receiving layer No. 7 (invention) | |
| gelatin | 0.980 |
| carboxymethyl cellulose (sodium salt) | 0.070 |
| TERGITOL 4 (tradename) | 0.004 |
| sodium hydroxide | 0.009 |
| physical development nuclei dispersion P | 4.050 |
| ethyl gallate | 1.000 |

HOSTAPON T is a tradename of Hoechst AG (D) for the wetting agent oleylmethyltauride
TERGITOL 4 is a tradename of Union Carbide & Carbon (USA) for the wetting agent sodium isotetradecyl sulfate.

Ink Jet Printing

The reservoir of a MICROJET (tradename) ink jet printer of XAAR Ltd. (GB) was filled for each printing operation with an ink prepared as defined above. The applied type of printer is a "drop-on-demand" ink jet printer having 64 ink channels with a nozzle diameter of 100 μm projecting ink drops having a diameter of about 140 μm diameter onto the above defined ink-receiving layers 1 to 7.

The printer was operated in such a way that large solid area of deposited ink were formed.

In a first test A these solid area were built up by single adjacently deposited ink droplets.

In a second test B these solid area were built up by duplets (pairs) of overlapping droplets.

In a third test C these solid area were built up by triplets of overlapping droplets.

In a fourth test D these solid area were built up by quadruplets of overlapping droplets.

The optical density of the thus obtained solid area was measured in transmission with a MacBeth (tradename) TD 904 densitometer through an ortho filter (green light transmitting filter) and ultraviolet (UV) blocking filter respectively.

The optical density (D) values measured through "ortho" and "UV" filter are listed in the following Table 1.

TABLE 1

| Number of overlapping Droplets → | 0 | 1 | 2 | 3 | 4 |
|---|---|---|---|---|---|
| Ink-receiving layer No. | | | | | |
| 1 D (ortho) | 0.05 | 0.30 | 0.55 | 0.80 | — |
| 1 D (UV) | 0.07 | 0.33 | 0.60 | 0.81 | — |
| 2 D (ortho) | 0.05 | 0.05 | — | — | — |
| 2 D (UV) | 0.07 | 0.07 | — | — | — |
| 3 D (ortho) | 0.05 | 0.05 | — | — | — |
| 3 D (UV) | 0.07 | 0.07 | — | — | — |
| 4 D (ortho) | 0.05 | 2.36 | 3.36 | 3.75 | 3.90 |
| 4 D (UV) | 0.07 | 2.63 | 3.44 | 3.72 | 3.84 |
| 5 D (ortho) | 0.05 | 1.75 | 2.83 | 3.90 | 4.31 |
| 5 D (UV) | 0.07 | 2.23 | 3.22 | 3.77 | 4.05 |
| 6 D (ortho) | 0.05 | 2.17 | 3.27 | 4.63 | 5.13 |
| 6 D (UV) | 0.07 | 2.21 | 3.35 | 4.59 | 4.98 |
| 7 D (ortho) | 0.05 | 2.05 | 3.06 | 4.60 | 5.21 |
| 7 D (UV) | 0.07 | 2.11 | 3.18 | 4.53 | 4.93 |

By these results is clearly shown that the presence of development nuclei is of major importance in the production of high optical density images.

By the presence of a black dye, e.g. azo dye, in the above defined ink the optical density in area of single droplet deposition could be easily raised above 3.00 when using an ink-receiving material containing a reducing agent and development nuclei.

EXAMPLE 2 (comparative example)

Preparation of the Ink 1 part of silver acetate was dissolved in a mixture of 49 parts of isopropanol and 50 parts of water.

Ink-Receiving Materials

The ink-receiving materials used in conjunction with said ink were the ink-receiving materials No. 2, 4 and 6 of Example 1, in which material No. 2 does not contain physical development nuclei.

The ink jet printing proceeded as described in Example 1 forming a large solid area of deposited ink of non-overlapping ink droplets.

Optical densities were measured in transmission using an ortho-filter as described in Example 1 and were 0.39, 2.48 and 2.78 respectively in the inked area of the ink-receiving materials 2, 4 and 6.

EXAMPLE 3 (comparative example)

Preparation of the Ink 10 parts of ascorbic acid were dissolved in 90 parts demineralized water.

Ink-Receiving Materials

The ink-receiving materials used in conjunction with said ink were the ink-receiving materials No. I and II having an ink-receiving layer as described hereinafter applied to a subbed polyethylene terephthalate support having a thickness of 100 µm.

| Ink-receiving layer No. I (non-invention) free of nuclei | |
| --- | --- |
| gelatin | 0.800 |
| AEROSOL OT (tradename) | 0.560 |
| silver behenate | 4.360 |
| Ink-receiving layer No. II (invention) | |
| silver behenate | 4.360 |
| gelatin | 0.800 |
| AEROSOL OT (tradename) | 0.560 |
| physical development nuclei dispersion N | 3.480 |

Physical development nuclei dispersion N is a 5.6% aqueous gelatin solution containing 0.01 mole of colloidal $Ag_2S$-NiS nuclei.

Ink jet printing proceeded as described in Example 1 forming a large solid area of deposited ink of non-overlapping ink droplets.

Optical densities were measured in transmission using an ortho-filter as described in Example 1 and were in the inked area 1.22 and 2.60 of the ink-receiving materials I and II respectively.

EXAMPLE 4 (non-invention example for comparative purposes)

Preparation of the Ink (see Example 1 of U.S. Pat. No. 4,266,229)

A solution was prepared of 5 parts of $AgNO_3$, 1.00 part of $HNO_3$, 40.00 parts of water and 54.00 parts of methanol.

Preparation of Ink-Receiving Material

A subbed polyethylene terephtalate support having a thickness of 100 µm was coated with an aqueous gelatin solution to form after drying a gelatin coating at a coverage of 2 $g/m^2$ which layer formed an ink-receiving layer.

Ink Jet Printing

By continuous ink jet printer a scanningwise modulated jet of the above ink was directed to said ink-receiving layer forming thereon a large inked area.

The thus inked material was divided into three strips, one of which was kept in the dark for 90 h before measuring the obtained optical density, a second part of which was fixed inside the laboratory near a window at the south side were it was left to daylight exposure for about 3 days, and a third strip was exposed at a distance of 100 cm to ultraviolet radiation of a 2000 W ferrichloride doped high-pressure mercury-vapour lamp during 100 seconds.

The obtained optical densities of the inked parts in the strips 1, 2 and 3 were measured as described in Example 1 in transmission through ortho-filter and were 0.10, 0.80 and 0.98 respectively. The background density was 0.03.

We claim:

1. An ink jet printing process comprising the steps of image-wise projecting droplets of liquid onto a receiving material thus bringing into working relationship on said receiving material a reducible metal compound (A), a reducing agent (B) for said metal compound and physical development nuclei (C) that catalyze the reduction of said metal compound to metal.

2. Process according to claim 1, wherein said physical development nuclei are present on the receiving material together with one member of said metal compound (A) and said reducing agent (B) and the remaining member and alkali are present in said droplets.

3. Process according to claim 1, wherein said droplets contain said metal compound (A) and are projected imagewise onto said receiving material containing said reducing agent (B) and said physical development nuclei.

4. Process according to claim 3, wherein said metal compound is a silver compound and is present in the droplets in a concentration in the range of 0.1 mole/l to 6 mole/l.

5. Process according to claim 1, wherein said droplets contain reducing agent (B) and are projected imagewise onto said receiving material containing said metal compound (A) and said physical development nuclei (C).

6. Process according to claim 1, wherein said droplets contain (an) alkali substance(s) giving the droplets a pH of at least 8 and are projected imagewise onto said receiving material containing said metal compound (A), said reducing agent (B) and said physical development nuclei (C).

7. Process according to claim 1, wherein a number of said droplets contain said compound (A) and a number of said droplets contain said reducing agent (B) and are projected imagewise from different jets onto said receiving material containing said physical development nuclei (C).

8. Process according to claim 1, wherein said droplets represent a physical developer by the presence therein of said reducing agent (B) in admixture with said reducible metal compound (A) in a form which cannot be reduced by said admixed reducing agent in the absence of physical development nuclei, and said droplets are projected imagewise onto said receiving material containing said physical development nuclei (C).

9. Process according to claim 1 wherein said metal compound is a silver compound.

10. Process according to claim 9, wherein said silver compound is a water-soluble inorganic or organic silver compound.

11. Process according to claim 9, wherein said silver compound is selected from the group consisting of silver nitrate and complex salts of silver with ammonia, amines, thiosulfate or thiocyanate ions.

12. Process according to claim 9, wherein said silver compound is selected from the group consisting of silver acetate, silver lactate, silver salicylate and silver di-(2-ethylhexyl)-sulphosuccinate.

13. Process according to claim 1, wherein said droplets contain water or water in admixture with (a) water-miscible organic solvent(s).

14. Process according to claim 1, wherein the droplets have an optical density as a result of their containing a black colorant or mixture of colorants whereby the optical density of the deposited colorant(s) is added to the optical density of the metal obtained by reduction.

15. Process according to claim 1, wherein the droplets have a pH in the range of 7.5 to 11.

16. Process according to claim 1, wherein physical development nuclei usable in silver complex diffusion transfer reversal (DTR-) processing are used as said physical development nuclei.

17. Process according to claim 16, wherein said physical development nuclei are colloidal noble metal particles or colloidal heavy metal sulfide particles.

18. Process according to claim 1, wherein the receiving material contains an ink-receiving layer containing a protein-type binding agent, polyvinyl alcohol, dextran, gum arabic, zein, agar-agar, arrowroot, pectin, carboxymethyl cellulose, hydroxyethyl cellulose, poly(acrylic acid), polyvinylpyrrolidone or mixtures thereof.

19. Process according to claim 1, wherein a reducing agent usable in silver diffusion transfer reversal (DTR-) processing is said reducing agent.

20. Process according claim 1, wherein a mixture of reducing agents is used the main reducing agent being of the polyhydroxy-benzene type and a secondary developing agent being of the class of 1-phenyl-3-pyrazolidinone compounds and N-methyl-aminophenol compounds.

21. Process according to claim 1, wherein said receiving material contains an ink receiving layer containing the reducing agent(s) wherein the weight ratio of binder to reducing agent(s) is in the range of 0.2 to 6, and the thickness of the ink receiving layer is in the range of 1 to 20 µm.

22. Process according to claim 1, wherein said receiving material is heated during and/or after deposition thereon of the droplets.

23. Process according to claim 1, wherein said physical development nuclei are present on the receiving material together with said metal compound (A) and said reducing agent (B) and alkali is present in said droplets.

* * * * *